(12) United States Patent
Suemasa et al.

(10) Patent No.: US 11,309,134 B2
(45) Date of Patent: Apr. 19, 2022

(54) CAPACITOR

(71) Applicant: TAIYO YUDEN CO., LTD., Tokyo (JP)

(72) Inventors: Riki Suemasa, Tokyo (JP); Takayuki Sekiguchi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 64 days.

(21) Appl. No.: 16/524,295

(22) Filed: Jul. 29, 2019

(65) Prior Publication Data

US 2020/0051749 A1 Feb. 13, 2020

(30) Foreign Application Priority Data

Aug. 9, 2018 (JP) .............................. JP2018-150365

(51) Int. Cl.
*H01G 4/33* (2006.01)
*H01G 4/008* (2006.01)
(Continued)

(52) U.S. Cl.
CPC ............... *H01G 4/33* (2013.01); *H01G 4/008* (2013.01); *H01G 4/06* (2013.01); *H01G 4/232* (2013.01);
(Continued)

(58) Field of Classification Search
CPC ............ H01G 4/12; H01G 4/005; H01G 4/10; H01G 4/01; H01G 28/60; H05K 1/18; H05K 2201/10015
See application file for complete search history.

(56) References Cited

U.S. PATENT DOCUMENTS

2014/0144681 A1\* 5/2014 Pushparaj ............... C23C 28/34
174/257
2015/0318296 A1\* 11/2015 Kim ................... H01L 27/11556
257/296
(Continued)

FOREIGN PATENT DOCUMENTS

JP 2009-135311 A 6/2009
JP 2009-295925 A 12/2009
(Continued)

OTHER PUBLICATIONS

Notice of Reasons for Refusal dated Nov. 30, 2021 issued in corresponding Japanese Patent Application No. 2018-150365, with English translation (8 pgs.).

*Primary Examiner* — Michael P McFadden
(74) *Attorney, Agent, or Firm* — Pillsbury Winthrop Shaw Pittman, LLP

(57) ABSTRACT

A capacitor according to one embodiment of the present invention relates to a thin film capacitor including a base member and a MIM structure provided on the base member. The thin film capacitor includes a first external electrode and a second external electrode that are electrically connected to the MIM structure. The base member has a plurality of through holes penetrating between a first surface and a second surface of the base member. The MIM structure includes a first portion extending along the first surface of the base member, a second portion extending along the second surface of the base member, and a third portion provided in the plurality of through holes of the base member so as to connect the first portion to the second portion.

9 Claims, 5 Drawing Sheets

(51) Int. Cl.
    *H01G 4/06*     (2006.01)
    *H01G 4/30*     (2006.01)
    *H05K 1/16*     (2006.01)
    *H01L 49/02*     (2006.01)
    *H01G 4/232*     (2006.01)

(52) U.S. Cl.
    CPC .............. *H01G 4/30* (2013.01); *H01L 28/75* (2013.01); *H05K 1/162* (2013.01); *H05K 2201/0179* (2013.01)

(56) References Cited

U.S. PATENT DOCUMENTS

2016/0233026 A1*   8/2016   Masuda ................. H01G 4/248
2018/0308638 A1*  10/2018   Ryou ....................... H01G 4/33

FOREIGN PATENT DOCUMENTS

| | | | |
|---|---|---|---|
| JP | 2012-089743 A | 5/2012 |
| JP | 2013-153020 A | 8/2013 |

\* cited by examiner

CAPACITOR

CROSS-REFERENCE TO RELATED APPLICATIONS

This application is based on and claims the benefit of priority from Japanese Patent Application Serial No. 2018-150365 (filed on Aug. 9, 2018), the contents of which are hereby incorporated by reference in their entirety.

TECHNICAL FIELD

The present disclosure relates to a thin film capacitor that generates a capacitance by using a MIM (metal-insulator-metal) structure formed by a thin film process. More specifically, the present disclosure relates to a thin film capacitor capable of reducing an equivalent series resistance (ESR).

BACKGROUND

There is known a thin film capacitor that includes a MIM structure formed by a thin film process and generates a capacitance by using the MIM structure. It has been demanded that the thin film capacitor be improved in capacitance generated per unit area so that a size reduction thereof or a higher capacitance can be achieved.

A trench capacitor is known as a thin film capacitor that can be improved in capacitance generated per unit area. The trench capacitor includes a base member having a multitude of unevenness structures referred to as trenches and a MIM structure provided to partly extend along the trenches. In the trench capacitor, the MIM structure is provided also in the trenches extending in a thickness direction of the base member, and thus a capacitance per unit area can be improved.

As pointed out in Japanese Patent Application Publication No. 2009-135311 (the '311 Publication), in such a trench capacitor, the MIM structure extends also in the thickness direction of the base member, and thus an electric current path in the MIM structure has an increased length. As a result, the trench capacitor has a drawback of having an increased equivalent series resistance (ESR). This drawback becomes more severe as an aspect ratio of the trenches is increased so that a higher capacitance or a size reduction can be achieved.

To address this drawback, in a trench capacitor described in Japanese Patent Application Publication No. 2009-295925 (the '925 Publication), an attempt is made to reduce the ESR by increasing a thickness of each of an upper electrode and a lower electrode that are components of the MIM structure. Increasing the thickness of each of the upper electrode and the lower electrode, however, might lead to a decrease in capacitance generated per unit area. As a result, a capacitor area for obtaining a required capacitance might be increased.

There is a demand for a thin film capacitor capable of reducing the ESR without increasing a thickness of an electrode layer that is a component of the MIM structure. Regarding this demand, in the trench capacitor described in the '311 Publication described above, an attempt is made to reduce the ESR by providing an auxiliary conductor so as to reduce the length of the path of an electric current flowing through the capacitor. More specifically, in the '311 Publication described above, it is attempted to reduce the length of the electric current path by providing the auxiliary conductor that electrically connects parts of an upper electrode of the MIM structure spaced from each other via each of the trenches or parts of a lower electrode of the MIM structure spaced from each other via each side wall defining the trenches.

In the capacitor described in the '311 Publication, however, an electric current flowing through the auxiliary conductor makes no contribution to the generation of a capacitance. An electric current contributing to the generation of a capacitance flows in each of the electrodes from an upper end to a lower end thereof along the trenches. As described above, in the capacitor described in the '311 Publication, the length of the electric current path is not decreased in each of the electrodes functioning as a capacitance-generating portion. Hence, it is conceivable that an effect of reducing the ESR in the capacitor described in the '311 Publication remains limited.

SUMMARY

One object of the present disclosure is to provide a novel thin film capacitor capable of reducing an ESR. A more specific object of the present invention is to provide a novel thin film capacitor capable of reducing an ESR without increasing a thickness of an electrode that generates a capacitance. Other objects of the present disclosure will be made apparent through the entire description herein.

A capacitor according to one embodiment of the present invention relates to a thin film capacitor including a base member and a MIM structure provided on the base member. The MIM structure may include a first dielectric layer, a first electrode layer provided on a lower surface of the first dielectric layer, and a second electrode layer provided on an upper surface of the first dielectric layer. The thin film capacitor includes a first external electrode and a second external electrode that are electrically connected to the MIM structure. Furthermore, the thin film capacitor may include a protective film provided so as to cover the MIM structure.

In one embodiment, the base member has a first surface and a second surface opposed to the first surface, a plurality of through holes extending through the base member between the first surface and the second surface.

The MIM structure in one embodiment is provided on the base member so as to be at least partly embedded in the plurality of through holes. The MIM structure in one embodiment includes a first portion extending along the first surface of the base member, a second portion extending along the second surface of the base member, and a third portion provided in the plurality of through holes of the base member so as to connect the first portion to the second portion.

The first external electrode and the second external electrode are spaced from each other. In one embodiment, the first external electrode is connected to the MIM structure at the first portion and the second portion, and the second external electrode is connected to the MIM structure at the first portion and the second portion. A first connection position at which the first external electrode is connected to the first portion of the MIM structure is spaced from a second connection position at which the second external electrode is connected to the first portion of the MIM structure. Similarly, a third connection position at which the first external electrode is connected to the second portion of the MIM structure is spaced from a fourth connection position at which the second external electrode is connected to the second portion of the MIM structure.

According to the above-described embodiment, an electric current from the first external electrode flows into the MIM structure from the first portion thereof provided near the first surface of the base member and from the second portion thereof provided near the second surface of the base member. That is, an electric current from the first external electrode flows in the form of parallel flows (or in the form of split two flows) into the MIM structure, and these parallelized electric currents flow through the MIM structure to the second external electrode. As described above, an electric current from the first external electrode flows in the form of parallel flows through the MIM structure, and thus an ESR in the MIM structure can be reduced. That is, according to the above-described embodiment, an electric current path in the MIM structure is in the form of parallel paths, and thus the ESR is reduced.

According to the above-described embodiment, in the third portion of the MIM structure, electric currents flow, respectively, from both ends of the through holes toward a center in a depth direction thereof, are folded at a vicinity of the center, and then flow from the center in the depth direction toward the both ends of the through holes, respectively. For example, in the third portion of the MIM structure, an electric current flowing from near the first surface with respect to the through holes toward the center is folded at the vicinity of the center and returns to near the first surface. As for a path length of an electric current flowing through the third portion of the MIM structure, a path length of an electric current flowing from near the first surface toward the center is about half a depth of the through holes, and a path length of the electric current returning from the center to near the first surface is also half the depth of the through holes, so that a to-and-fro path length of the electric current flowing through the single third portion in the through holes of the MIM structure is about the same as the depth of the through holes. In the conventional trench capacitor, a path length of an electric current flowing in bottomed trenches is about double a depth of the trenches. Consequently, according to the above-described embodiment, a path length of an electric current flowing in a thickness direction of the base member can be decreased compared with that of the conventional trench capacitor.

According to the above-described embodiment, the MIM structure is embedded in the through holes penetrating the base member from the first surface to the second surface thereof, and thus a surface area of the MIM structure can be increased compared with that of the conventional trench capacitor in which the MIM structure is embedded in the bottomed trenches. Thus, according to the thin film capacitor in the above-described embodiment, a capacitance per unit area can be increased compared with that of the conventional trench capacitor in which the MIM structure is embedded in the bottomed trenches. Furthermore, according to the thin film capacitor of the above-described embodiment, even when the dielectric layer in the MIM structure is increased in thickness, there can be generated about the same capacitance as in the case of the conventional trench capacitor in which the MIM structure is embedded in the bottomed trenches. Hence, according to the above-described embodiment, a thin film capacitor excellent in insulation reliability can be obtained. In addition, according to the above-described embodiment, even when the base member is decreased in thickness, there can be generated about the same capacitance as in the case of the conventional trench capacitor in which the MIM structure is embedded in the bottomed trenches. Hence, according to the above-described embodiment, a thin film capacitor having a reduced profile can be obtained.

The first external electrode in one embodiment includes a first electrode portion extending along the first surface, a second electrode portion extending along the second surface, and a first connection electrode portion connecting the first electrode portion to the second electrode portion. The second external electrode in one embodiment includes a third electrode portion extending along the first surface, a fourth electrode portion extending along the second surface, and a second connection electrode portion connecting the third electrode portion to the fourth electrode portion.

In one embodiment, the first external electrode is configured so that a thickness T1 of the first connection electrode portion is ten or more times as large as at least one of a thickness t1 of the first electrode layer and a thickness t2 of the second electrode layer. In one embodiment, the second external electrode is configured so that a thickness T2 of the second connection electrode portion is ten or more times as large as at least one of the thickness t1 of the first electrode layer and the thickness t2 of the second electrode layer.

In a case where the above-described thin film capacitor is installed on a circuit board, the first electrode portion or the second electrode portion of the first external electrode is joined to a bump of the circuit board. For example, in a case where the second electrode portion is connected to the bump of the circuit board, part of an electric current that has flowed from the circuit board into the first external electrode via the second electrode portion flows to the first electrode portion through the first connection electrode portion. Accordingly, in the above-described thin film capacitor, a path length is increased by a length of an electric current path passing through the first connection electrode portion. However, with the thickness of the first connection electrode portion being larger than each of the thickness t1 of the first electrode layer and the thickness t2 of the second electrode layer, it is possible to suppress the influence of an increase in ESR in the first connection electrode portion on an ESR in an entire path from the first external electrode to the second external electrode. In particular, with the thickness of the first connection electrode portion being ten or more times as large as the thickness t1 of the first electrode layer and/or the thickness t2 of the second electrode layer, the influence on the ESR in the entire path can be significantly reduced.

Another embodiment of the present invention relates to a circuit board including any one of the above-described thin film capacitors. Yet another embodiment of the present invention relates to an electronic device including the circuit board.

Depending on how the thin film capacitor is connected to the circuit board, an electric current may flow from the second external electrode toward the first external electrode. Also in a case where an electric current flows from the second external electrode to the first external electrode, the thin film capacitor according to the above-described embodiment can achieve the above-described advantageous effects. For example, the effect that an electric current flowing through the MIM structure flows in the form of parallel flows and the effect that a length of an electric current path in the through holes is decreased are achieved regardless of an electric current flow direction.

Advantages

According to various embodiments disclosed herein, a novel thin film capacitor capable of reducing an ESR can be provided.

BRIEF DESCRIPTION OF THE DRAWINGS

FIG. 3A schematically shows an electric current flow in the thin film capacitor according to one embodiment.

DESCRIPTION OF EXAMPLE EMBODIMENTS

Hereinafter, various embodiments of the present invention will be described with reference to the appended drawings as appropriate. Constituent elements common to a plurality of drawings are denoted by the same reference signs throughout the plurality of drawings. It should be noted that the drawings are not necessarily depicted to scale for the sake of convenience of explanation.

Figure 1:
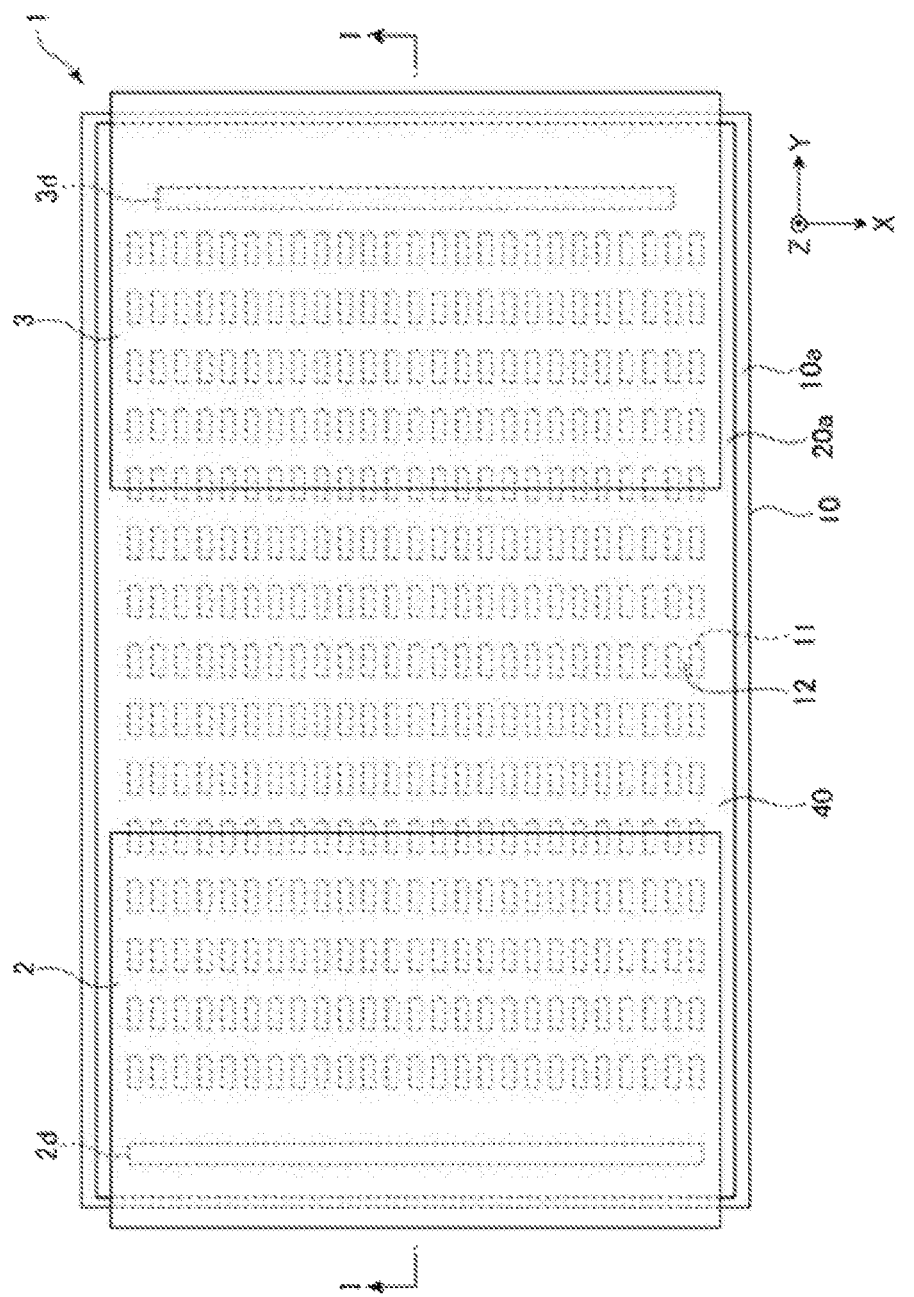
FIG. 1 is a plan view of a thin film capacitor according to one embodiment.
Figure 2:
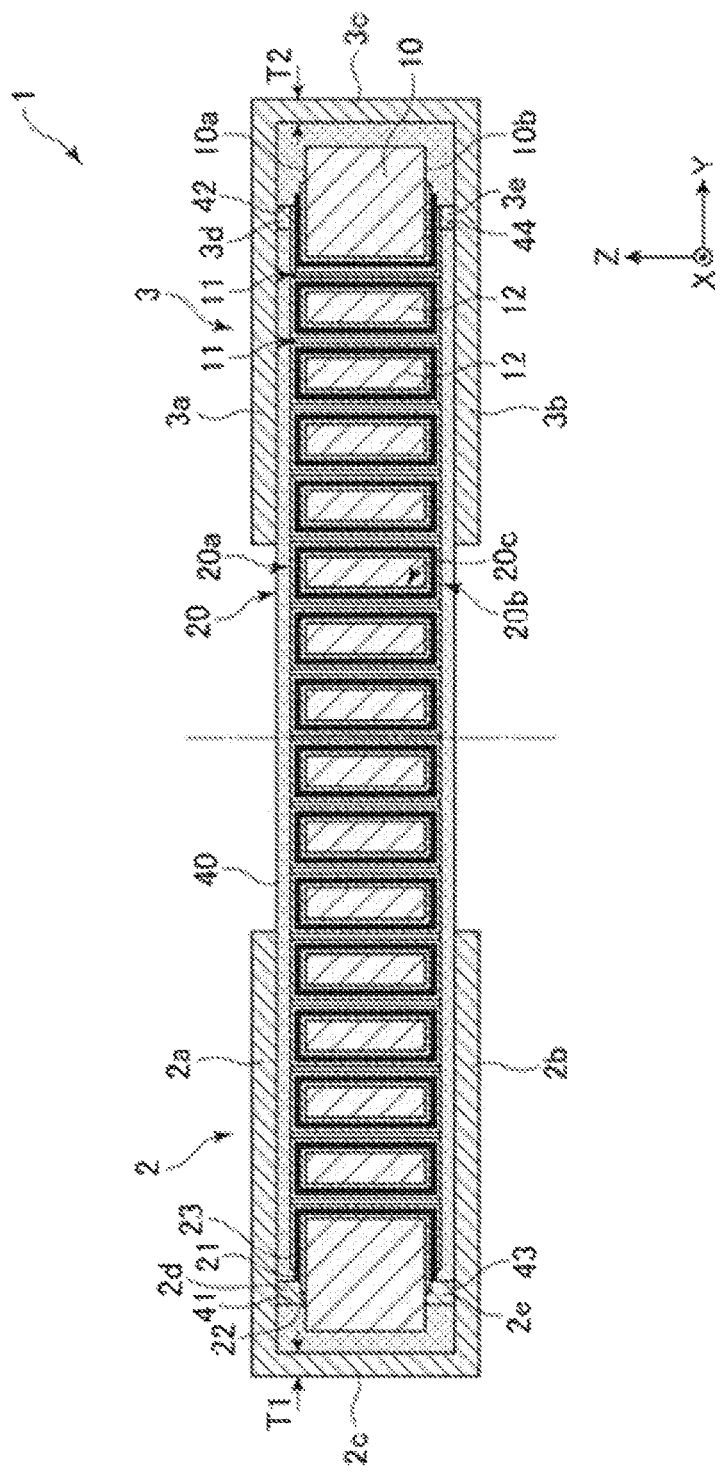
FIG. 2 is a sectional view schematically showing a YZ section of the thin film capacitor shown in FIG. 1 cut along a line I-I.

A thin film capacitor 1 according to one embodiment will now be described with reference to FIG. 1 to FIG. 2. FIG. 1 is a plan view of the thin film capacitor 1, and FIG. 2 is a sectional view schematically showing a section of the thin film capacitor 1 cut along a line I-I.

As shown, the thin film capacitor 1 according to one embodiment includes a base member 10, a MIM structure 20 provided on the base member 10, and a protective layer 40 provided so as to cover the MIM structure 20. An unshown barrier layer may be provided between the MIM structure 20 and the protective layer 40. An external electrode 2 and an external electrode 3 are provided on an outside of the protective layer 40. As will be detailed later, the external electrode 2 and the external electrode 3 are electrically connected to electrode layers that are components of the MIM structure 20, respectively.

The external electrode 2 and the external electrode 3 are joined to a land provided on a circuit board, and thus the thin film capacitor 1 is mounted on the circuit board. The circuit board can be installed in various electronic devices. Examples of an electronic device including the circuit board on which the thin film capacitor 1 is mounted include a smartphone, a mobile phone, a tablet terminal, a game console, and any other electronic device that can include the circuit board on which the thin film capacitor 1 is mounted.

The drawings including FIG. 1 show an X direction, a Y direction, and a Z direction orthogonal to one another. Herein, orientations and arrangements of constituent members of the thin film capacitor 1 may be described based on the X direction, the Y direction, and the Z direction shown in these drawings. Specifically, a "width" direction, a "length" direction, and a "thickness" direction of the thin film capacitor 1 correspond to a direction along an X axis, a direction along a Y axis, and a direction along a Z axis in FIG. 1, respectively, unless otherwise construed from the context. Herein, a top-bottom direction of the thin film capacitor 1 and the constituent members thereof is based on a top-bottom direction in FIG. 1. That is, a positive direction of the Z axis is defined as an upper direction of the thin film capacitor 1, and a negative direction of the Z axis is defined as a lower direction of the thin film capacitor 1, unless otherwise construed from the context.

First, a description is given of the base member 10 and a plurality of through holes 11 provided through the base member 10. In one embodiment, the base member 10 is made of an insulating material such as Si. In one embodiment, the base member 10 is formed in a substantially rectangular parallelepiped shape and has a dimension in a width direction (an X-axis direction) of, for example, 50 μm to 5000 μm, a dimension in a length direction (a Y-axis direction) of, for example, 50 μm to 5000 μm, and a dimension in a thickness direction (a Z-axis direction) of, for example, 5 μm to 500 μm. The dimensions of the base member 10 specifically described herein are merely illustrative, and the base member 10 may have any dimensions.

The base member 10 has an upper surface 10a and a lower surface 10b. The base member 10 has the plurality of through holes 11 penetrating between the upper surface 10a and the lower surface 10b. The plurality of through holes 11 extend along the Z-axis direction (that is, along the top-bottom direction) between the upper surface 10a and the lower surface 10b. As shown in FIG. 1, each of the plurality of through holes 11 is formed in a substantially rectangular shape in plan view, which is defined by a side extending along the X-axis direction and a side extending along the Y-axis direction. In the embodiment shown, each of the plurality of through holes 11 is formed so that, in plan view, the side extending along the X-axis direction is shorter than the side extending along the Y-axis direction. The upper surface 10a is an example of a first surface of the base member 10, and the lower surface 10b is an example of a second surface of the base member 10.

In one embodiment, each of the plurality of through holes 11 is formed to have a high aspect ratio so that a higher capacitance per unit area can be obtained. That is, each of the plurality of through holes 11 is formed to have an increased ratio of its depth to its width (for example, a length of the side thereof in the X-axis direction). The depth of each of the plurality of through holes 11 is equal to a distance between the upper surface 10a and the lower surface 10b. Each of the plurality of through holes 11 has a width (a dimension thereof in the X-axis direction) of, for example, 0.5 μm to 2 μm, a length (a dimension thereof in the Y-axis direction) of, for example, 5 μm to 20 μm, and a depth (a dimension thereof in the Z-axis direction) of, for example, 1 μm to 100 μm. A distance between two adjacent ones of the through holes 11 is, for example, 0.5 μm to 2 μm in the X-axis direction and 1 μm to 10 μm in the Y-axis direction. The dimensions of the through holes 11 specifically described herein are merely illustrative, and the through holes 11 may have any dimensions. Furthermore, each of the through holes 11 is not limited in shape in plan view to a rectangular shape and may have any shape in plan view. In one embodiment, each of the through holes 11 is configured to have a depth (the dimension in the Z-axis direction) of 40 μm, a width (the dimension in the X-axis direction) of 1.0 μm, and a length (the dimension in the Y-axis direction) of 19 μm.

The through holes 11 can be formed by, for example, forming a mask on a surface of an Si substrate, the mask having openings corresponding to a pattern of the through holes 11, and then etching the Si substrate. The Si substrate can be etched by a reactive ion etching method such as deep RIE (deep reactive etching). By this etching, for example, holes are bored from a surface of the Si substrate corresponding to the upper surface 10a toward a surface of the Si substrate corresponding to the lower surface 10b. The through holes 11 may be formed by etching to bore holes through a base member from a surface thereof corresponding to the upper surface 10a to a surface thereof corresponding to the lower surface 10b. Alternatively, the through holes 11 may be formed by performing etching from a surface corresponding to the upper surface 10a to a point before reaching a surface corresponding to the lower surface 10b so as to form bottomed holes, followed by cutting a part of the surface corresponding to the lower surface 10b at a position corresponding to each of the bottomed holes.

Two adjacent ones of the plurality of through holes 11 are separated from each other by a side wall 12. In other words, the side wall 12 is a part of the base member 10 and is configured to separate two adjacent ones of the through holes 11 from each other.

Next, a further description is given of the MIM structure 20. As described earlier, the MIM structure 20 is provided on the base member 10. As shown, the MIM structure 20 is provided on the base member 10 so as to be embedded in each of the through holes 11.

As shown, the MIM structure 20 is a laminate composed of a dielectric layer and a conductor layer alternately stacked on each other. The MIM structure 20 in one embodiment includes a lower electrode layer 22, a dielectric layer 21 provided on the lower electrode layer 22, and an upper electrode layer 23 provided on the dielectric layer 21. Herein, for consistency with commonly used names "lower electrode" and "upper electrode," a top-bottom direction in the MIM structure 20 may not refer to the top-bottom direction along the Z-axis direction but assume that a direction closer to the base member 10 is a "lower" direction and a direction farther from the base member 10 is an "upper" direction. The MIM structure 20 may include two or more MIM layers. For example, in a case where the MIM structure 20 includes two MIM layers, a second MIM layer is formed on a first MIM layer composed of the lower electrode layer 22, the dielectric layer 21, and the upper electrode layer 23. For example, the second MIM layer may include a dielectric layer provided on the upper electrode layer 23 and an electrode layer provided on the dielectric layer. In this case, the upper electrode layer 23 functions as an upper-side electrode layer included in the first MIM layer and also as a lower-side electrode layer included in the second MIM layer.

The MIM structure 20 is configured to have a shape in conformity to the upper surface 10a and the lower surface 10b of the base member 10 as well as the through holes 11 thereof. In one embodiment, the MIM structure 20 includes an upper surface portion 20a extending along the upper surface 10a of the base member 10, a lower surface portion 20b extending along the lower surface 10b of the base member 10, and a trench portion 20c extending along an inner wall defining each of the though holes 11. The upper surface portion 20a and the lower surface portion 20b extend along an XY plane. The trench portion 20c extends in the Z-axis direction in each of the plurality of through holes 11. The upper surface portion 20a and the lower surface portion 20b are connected to each other via the trench portion 20c. The upper surface portion 20a is an example of a first portion of the MIM structure, the lower surface portion 20b is an example of a second portion of the MIM structure, and the trench portion 20c is an example of a third portion of the MIM structure.

Materials that can be used to form the dielectric layer 21 include barium strontium titanate (BST), barium titanate (BTO), strontium titanate (STO), silicon oxide ($SiO_2$), silicon nitride (SiN), silicon oxynitride (SiON), zirconia ($ZrO_2$), alumina ($Al_2O_3$), hafnium oxide ($HfO_2$), titanium oxide ($TiO_2$), and any other dielectric material. The material of the dielectric layer 21 is not limited to those explicitly described herein.

The dielectric layer 21 is formed by, for example, an atomic layer deposition (ALD) method, a sputtering method, a CVD method, or any other known method. The dielectric layer 21 is formed to have a thickness of, for example, 1 nm to 500 nm. In one embodiment, the dielectric layer 21 has a thickness of 30 nm.

Materials that can be used to form the lower electrode layer 22 and the upper electrode layer 23 include nickel (Ni), copper (Cu), palladium (Pd), platinum (Pt), silver (Ag), gold (Au), ruthenium (Ru), tungsten (W), molybdenum (Mo), titanium (Ti), conductive silicon, or any other metal material, an alloy material containing one or more of these metal elements, and compounds of the above-described metal elements. In one embodiment, titanium nitride (TiN) is used as the material of the lower electrode layer 22 and the upper electrode layer 23. The material of the lower electrode layer 22 and the upper electrode layer 23 is not limited to those explicitly described herein.

The lower electrode layer 22 and the upper electrode layer 23 are formed by, for example, the atomic layer deposition (ALD) method, the sputtering method, an evaporation method, a plating method, or any other known method. In one embodiment, the lower electrode layer 22 is formed to have a thickness t1 of, for example, 1 nm to 500 nm. In one embodiment, the upper electrode layer 23 is formed to have a thickness t2 of, for example, 1 nm to 500 nm. In one embodiment, each of the lower electrode layer 22 and the upper electrode layer 23 has a thickness of 30 nm. The thickness of each of the lower electrode layer 22 and the upper electrode layer 23 is not limited to those explicitly described herein.

Next, a description is given of the protective layer 40. In order to protect the MIM structure 20 from an exterior environment, the protective layer 40 is provided so as to cover the MIM structure 20 and the base member 10. The protective layer 40 is provided so as to protect the MIM structure 20 from, for example, external mechanical damage such as an impact. Materials that can be used to form the protective layer 40 include a resin material such as polyimide, silicon oxide ($SiO_2$), silicon nitride (SiN), silicon oxynitride (SiON), and any other insulating material. The protective layer 40 is formed by, for example, applying photosensitive polyimide by a spin coating method and subjecting the thus applied polyimide to exposure, development, and curing. The protective layer 40 can be formed by any other known method. The protective layer 40 is formed to have a thickness of, for example, 200 nm to 5000 nm. In one embodiment, the protective layer 40 has a thickness of 3000 nm. The material and thickness of the protective layer 40 are not limited to those explicitly described herein.

An unshown barrier layer may be provided between the protective layer 40 and the MIM structure 20 (or the base member 10). In order to improve weather resistance of the thin film capacitor 1, the barrier layer is provided mainly on the MIM structure 20. In one embodiment, the barrier layer is provided between the MIM structure 20 and the protective layer 40 so that moisture released from the protective layer 40 or moisture in the atmosphere will not reach the MIM structure 20. The barrier layer may be a thin film excellent in hydrogen gas barrier property. Materials that can be used to form the barrier layer include alumina ($Al_2O_3$), silicon oxide ($SiO_2$), silicon oxynitride (SiON), zirconia ($ZrO_2$), and any other insulating material. The barrier layer is formed by, for example, the sputtering method, the CVD method, or any other known method. The barrier layer is formed to have a thickness of, for example, 5 nm to 500 nm. In one embodiment, the barrier layer has a thickness of 50 nm. The material and thickness of the barrier layer are not limited to those explicitly described herein.

Next, a description is given of the external electrode 2 and the external electrode 3. The external electrode 2 and the external electrode 3 are provided on the outside of the protective layer 40 so as to be spaced from each other in the Y-axis direction. The external electrode 2 and the external electrode 3 are formed by applying a conductive paste containing a metal material on the outside of the protective layer 40. The external electrode 2 and the external electrode 3 can be made of a material such as copper (Cu), nickel (Ni), tin (Sn), palladium (Pd), platinum (Pt), silver (Ag), gold (Au), any other metal material, or an alloy material containing one or more of these metal elements. At least one of a solder barrier layer and a solder wetting layer may be formed on the external electrode 2 and the external electrode 3 as necessary.

The external electrode 2 includes an upper-side electrode portion 2a provided on an upper surface of the protective layer 40 so as to extend along the upper surface 10a of the base member 10 (that is, along the XY plane), a lower-side electrode portion 2b provided on a lower surface of the protective layer 40 so as to extend along the lower surface 10b of the base member 10 (that is, along the XY plane), and a connection electrode portion 2c connecting the upper-side electrode portion 2a to the lower-side electrode portion 2b. The connection electrode portion 2c is configured to extend along an XZ plane. The connection electrode portion 2c is provided to extend along an end surface of the base member 10 connecting the upper surface 10a to the lower surface 10b of the base member 10. In one embodiment, the connection electrode portion 2c is formed to have a thickness T1 of 5000 nm to 10000 nm. Each of the upper-side electrode portion 2a and the lower-side electrode portion 2b is also formed to have about the same thickness as the thickness of the connection electrode portion 2c. The external electrode 2 is an example of a first external electrode, the upper-side electrode portion 2a is an example of a first electrode portion, and the lower-side electrode portion 2b is an example of a second electrode portion. The connection electrode portion 2c is an example of a first connection electrode portion.

The external electrode 3 includes an upper-side electrode portion 3a provided on the upper surface of the protective layer 40 so as to extend along the upper surface 10a of the base member 10 (that is, along the XY plane), a lower-side electrode portion 3b provided on the lower surface of the protective layer 40 so as to extend along the lower surface 10b of the base member 10 (that is, along the XY plane), and a connection electrode portion 3c connecting the upper-side electrode portion 3a to the lower-side electrode portion 3b. The connection electrode portion 3c is configured to extend along the XZ plane. The connection electrode portion 3c is provided to extend along an end surface of the base member 10 connecting the upper surface 10a to the lower surface 10b of the base member 10. In one embodiment, the connection electrode portion 3c is formed to have a thickness T2 of 5000 nm to 10000 nm. Each of the upper-side electrode portion 3a and the lower-side electrode portion 3b is also formed to have about the same thickness as the thickness of the connection electrode portion 3c. The external electrode 3 is an example of a second external electrode, the upper-side electrode portion 3a is an example of a third electrode portion, and the lower-side electrode portion 3b is an example of a fourth electrode portion. The connection electrode portion 3c is an example of a second connection electrode portion.

The protective layer 40 includes a part provided on an upper side of the MIM structure 20, the part having a groove 41 provided near an end thereof in a Y-axis negative direction and a groove 42 provided near an end thereof in a Y-axis positive direction. Similarly, the protective layer 40 includes a part provided on a lower side of the MIM structure 20, the part having a groove 43 provided near an end thereof in the Y-axis negative direction and a groove 44 provided near an end thereof in the Y-axis positive direction. The grooves 41 to 44 are all provided to extend along the X-axis direction so as to penetrate the protective layer 40 in the Z-axis direction. A lead-out electrode 2d is provided in the groove 41, and a lead-out electrode 2e is provided in the groove 43. Further, a lead-out electrode 3d is provided in the groove 42, and a lead-out electrode 3e is provided in the groove 44.

The lead-out electrode 2d is connected at its upper end to the external electrode 2 and at its lower end to the lower electrode layer 22 of the MIM structure 22. The lead-out electrode 2e is connected at its upper end to the lower electrode layer 22 of the MIM structure 20 and at its lower end to the external electrode 2. The lead-out electrode 3d is connected at its upper end to the external electrode 3 and at its lower end to the upper electrode layer 23 of the MIM structure 20. The lead-out electrode 3e is connected at its upper end to the upper electrode layer 23 of the MIM structure 20 and at its lower end to the external electrode 3. In order to achieve this connection, each of the lead-out electrodes 3d and 3e is configured to have a dimension in the X-axis direction smaller than a dimension in the X-axis direction of each of the lead-out electrodes 2d and 2e.

The lead-out electrodes 2d, 2e, 3d, and 3e can be made of a material such as copper (Cu), nickel (Ni), tin (Sn), palladium (Pd), platinum (Pt), silver (Ag), gold (Au), any other metal material, or an alloy material containing one or more of these metal elements. The lead-out electrodes 2d, 2e, 3d, and 3e are formed by the evaporation method, the sputtering method, the plating method, or any other known method.

The external electrode 2 is electrically connected to the lower electrode layer 22 of the MIM structure 20 at each of the upper surface portion 20a and the lower surface portion 20b of the MIM structure 20. More specifically, on an upper side of the base member 10, the external electrode 2 is electrically connected to a part of the lower electrode layer 22 lying at the upper surface portion 20a of the MIM structure 20 via the lead-out electrode 2d, and on a lower side of the base member 10, the external electrode 2 is electrically connected to a part of the lower electrode layer 22 lying at the lower surface portion 20b of the MIM structure 20 via the lead-out electrode 2e.

The external electrode 3 is electrically connected to the upper electrode layer 23 of the MIM structure 20 at each of the upper surface portion 20a and the lower surface portion 20b of the MIM structure 20. More specifically, on the upper side of the base member 10, the external electrode 3 is electrically connected to a part of the upper electrode layer 23 lying at the upper surface portion 20a of the MIM structure 20 via the lead-out electrode 3d, and on the lower side of the base member 10, the external electrode 3 is electrically connected to a part of the upper electrode layer 23 lying at the lower surface portion 20b of the MIM structure 20 via the lead-out electrode 3e.

Next, a description is given of a method for manufacturing the thin film capacitor according to one embodiment.

First, an Si base member is prepared, and a mask is provided on an upper surface of the base member, the mask having openings corresponding to a pattern of through holes. The mask has an opening pattern corresponding to the through holes 11 shown in FIG. 1. A plurality of openings formed through the mask are each formed in a substantially rectangular shape in plan view. Next, the base member on which the mask has been provided is etched, and thus the plurality of through holes are formed through the base member. The etching may be performed by the deep RIE. The through holes may be formed by performing etching and cutting in combination. In this case, the through holes are formed by etching the base member from an upper surface thereof to a point before reaching a lower surface thereof so as to form bottomed holes, followed by cutting a part of the lower surface of the base member at a position corresponding to each of the bottomed holes. In this manner, the base member 10 having the plurality of through holes 11 formed therein is obtained.

Next, the mask is removed from the base member 10, and then the lower electrode layer 22, the dielectric layer 21, and the upper electrode layer 23 are stacked on the surfaces of the base member 10 and in each of the through holes 11. For example, the dielectric layer 21 is made of zirconia, and the lower electrode layer 22 and the upper electrode layer 23 are made of TiN. The lower electrode layer 22, the dielectric layer 21, and the upper electrode layer 23 can be formed by the ALD method. The lower electrode layer 22, the dielectric layer 21, and the upper electrode layer 23 are formed in a shape in conformity to unevenness structures of the base member 10. The lower electrode layer 22, the dielectric layer 21, and the upper electrode layer 23 are formed on the upper surface 10a and the lower surface 10b of the base member 10 as well as in each of the plurality of through holes 11 thereof. Since the lower electrode layer 22, the dielectric layer 21, and the upper electrode layer 23 are stacked in the through holes 11 (stacked on the inner wall defining each of the through holes 11) instead of being stacked in the bottomed trenches as in the conventional case, these layers can be made more uniform in thickness. That is, in a case of forming an electrode layer and a dielectric layer by the ALD method, a raw material gas might not be sufficiently delivered to a bottom portion of each of the bottomed trenches, whereas in this embodiment, since, instead of the bottomed trenches, the through holes 11 are formed in the base member 10, a raw material gas can be evenly supplied into each of the through holes 11. Thus, in this embodiment, the lower electrode layer 22, the dielectric layer 21, and the upper electrode layer 23 can be made more uniform in thickness.

The material of the dielectric layer 22 is not limited to zirconia, and the material of the lower electrode layer 22 and the upper electrode layer 23 is not limited to TiN. The lower electrode layer 22, the dielectric layer 21, and the upper electrode layer 23 may be formed by any of various other known methods than the ALD method. In this manner, the MIM structure 20 formed by stacking the lower electrode layer 22, the dielectric layer 21, and the upper electrode layer 23 is provided on the base member 10.

Next, the protective layer 40 is formed on the MIM structure 20. Then, the grooves 41 and 42 are provided respectively near the both ends of the part of the protective layer 40 provided on the upper side of the MIM structure 20 in the Y-axis direction. Furthermore, the grooves 43 and 44 are provided respectively near the both ends of the part of the protective layer 40 provided on the lower side of the MIM structure 20 in the Y-axis direction. The grooves 41 to 44 are formed by, for example, etching.

Next, the lead-out electrodes 2d, 2e, 3d, and 3e are formed respectively in the grooves 41 to 44 by the plating method, and the external electrode 2 and the external electrode 3 are formed on the surfaces of the protective layer 40. In the above-described manner, the thin film capacitor 1 is obtained.

Figure 3A:
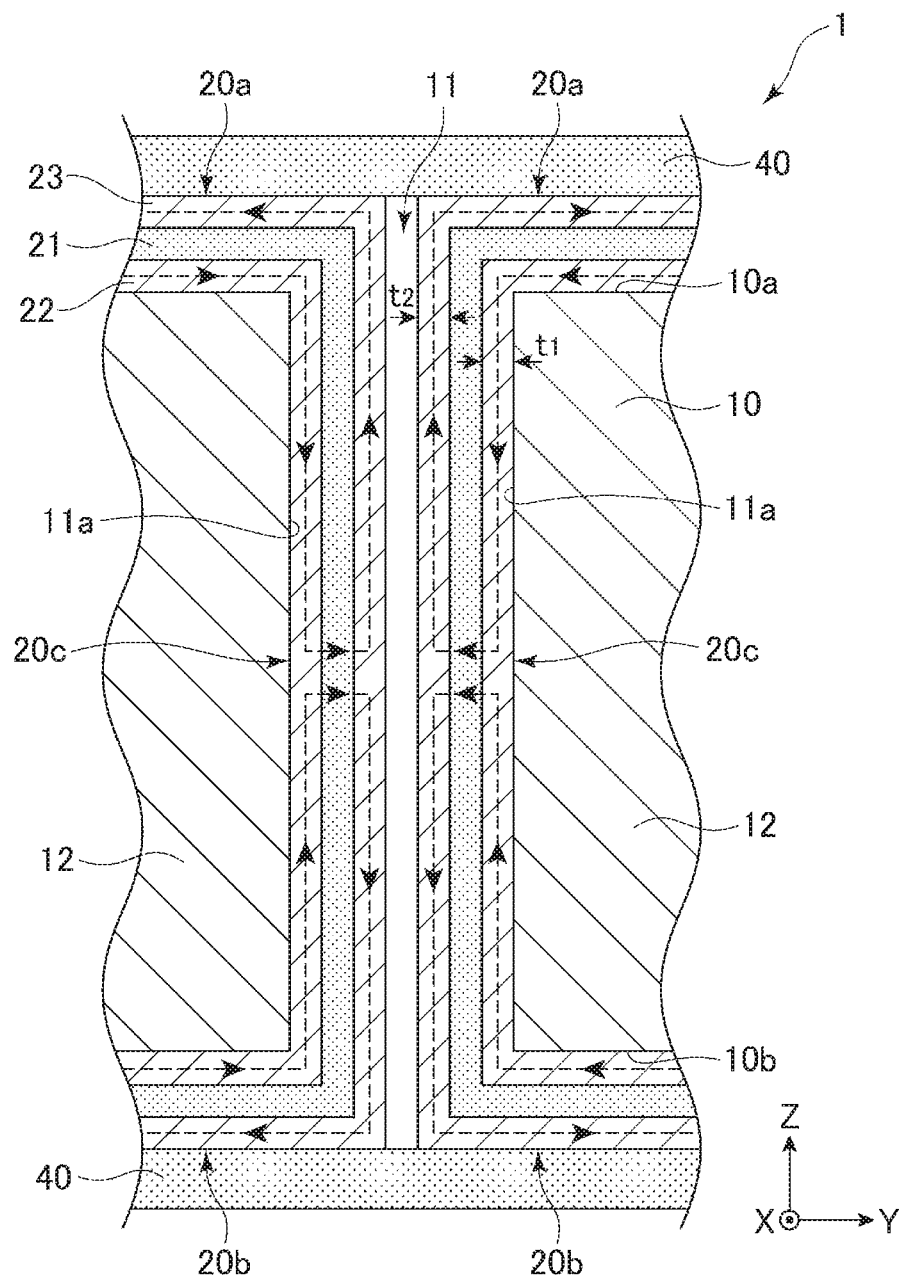
FIG. 3A is an enlarged sectional view schematically showing, on an enlarged scale, part of the YZ section shown in FIG. 2.
Figure 3B:
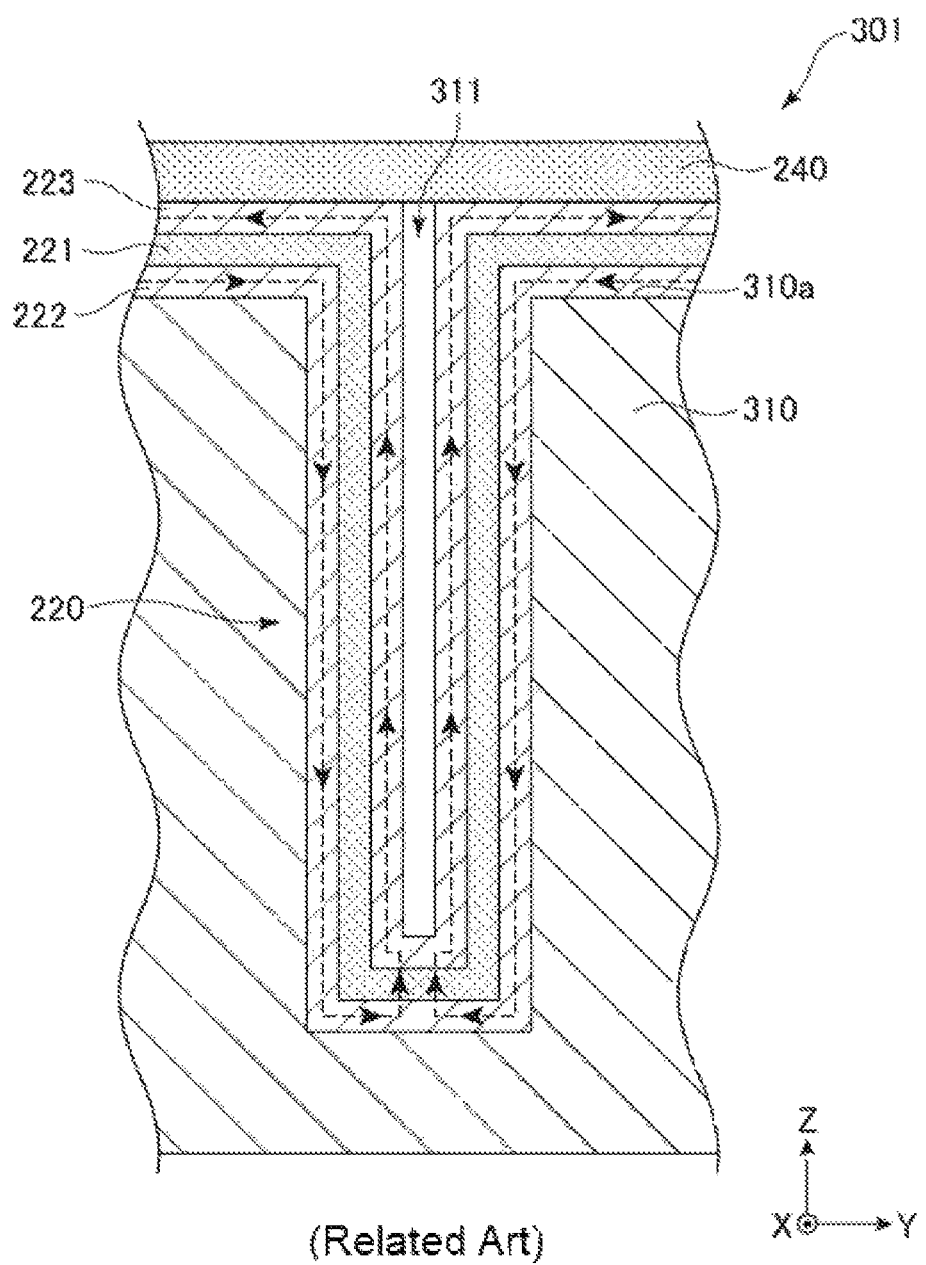
FIG. 3B is a schematic view schematically showing an electric current flow in a conventional thin film capacitor (a trench capacitor).

Next, with reference to FIG. 3A and FIG. 3B, a description is given of an electric current flow in the thin film capacitor 1 in comparison with an electric current flow in the conventional trench capacitor. FIG. 3A is an enlarged sectional view schematically showing, on an enlarged scale, part of a longitudinal section of the thin film capacitor 1 shown in FIG. 2. FIG. 3A schematically shows an electric current flow in the MIM structure 20 of the thin film capacitor 1. FIG. 3B is a schematic view schematically showing an electric current flow in the conventional typical trench capacitor in which the MIM structure is embedded in the trenches formed in the base member.

First, with reference to FIG. 3B, a description is given of an electric current flow in a conventional trench capacitor 301. FIG. 3B shows the conventional typical trench capacitor 301. In the trench capacitor 301, a trench 311 is formed in a base member 310, and a MIM structure 220 is embedded in the trench 311. A protective layer 240 is provided on an upper surface of the MIM structure 220 so as to cover the MIM structure 240. The MIM structure 220 includes a lower electrode layer 222, a dielectric layer 221, and an upper electrode layer 223. The lower electrode layer 222 is connected to a positive external electrode (not shown), and the upper electrode layer 223 is connected to a negative external electrode (not shown). In the conventional trench capacitor 301, an electric current supplied from the positive external electrode to the lower electrode layer 222 flows in the lower electrode layer 222 to the negative external electrode. Specifically, an electric current supplied from the positive external electrode to the lower electrode layer 222 flows in the lower electrode layer 222 in a direction along an upper surface 310a of the base member 310 and then flows downward to a bottom portion of the trench 311 along a depth direction thereof, where the electric current flows into the upper electrode layer 223 via the dielectric layer 221. The electric current that has flowed into the upper electrode layer 223 at the bottom portion of the trench 311 flows upward in the upper electrode layer 223 along the depth direction of the trench 311 and then flows along the upper surface 310a to reach the negative external electrode. As described above, it is conceivable that, in the conventional trench capacitor 301, an electric current flows back and forth for a distance corresponding to a depth of the trench 311 when flowing in the trench 311.

Next, with reference to FIG. 3A, a description is given of an electric current flow in the thin film capacitor 1 according to one embodiment. In the thin film capacitor 1, the external electrode 2 includes the upper-side electrode portion 2a and the lower-side electrode portion 2b, and the external electrode 3 includes the upper-side electrode portion 3a and the lower-side electrode portion 3b, so that both of an upper surface and a lower surface of the thin film capacitor 1 can be mounting surfaces. For the sake of convenience of explanation, the following description assumes that the lower-side electrode portion 2b of the external electrode 2 and the lower-side electrode portion 3b of the external electrode 3 are connected to a land of a circuit board, and thus the thin film capacitor 1 is mounted on the circuit board. In this case, an electric current supplied from the circuit board to the lower-side electrode portion 2b of the external electrode 2 flows into the lower electrode layer 22 at the lower surface portion 20b of the MIM structure 20 and also flows through the connection electrode portion 2c into the upper-side electrode portion 2a, from which the electric current flows into the lower electrode layer 22 at the upper surface portion 20a of the MIM structure 20. As described above, an electric current that has flowed from the external electrode 2 into the lower electrode layer 22 flows in the form of parallel flows (is split into two flows), one of which flows into the lower electrode layer 22 at the lower surface portion 20b and the other of which flows into the lower electrode layer 22 at the upper surface portion 20a.

While the electric current that has flown into the lower electrode layer 22 at the upper surface portion 20a flows downward into the through holes 11, the electric current that has flown into the lower electrode layer 22 at the lower surface portion 20b flows upward into each of the through holes 11. The electric current that has thus flown downward from the upper surface portion 20a into the each of the through holes 11 flows into the upper electrode layer 23 via the dielectric layer 21 at a vicinity of a center of the each of the through holes 11 in a depth direction thereof and then flows upward in the upper electrode layer 23 to return to the upper surface portion 20a. Similarly, the electric current that has flown upward from the lower surface portion 20b into the each of the through holes 11 flows into the upper electrode layer 23 via the dielectric layer 21 at the vicinity of the center of the each of the through holes 11 in the depth direction thereof and then flows downward in the upper electrode layer 23 to return to the lower surface portion 20a.

As described above, in the thin film capacitor 1, an electric current flowing in each of the through holes 11 (to be exact, an electric current flowing through the trench portion 20c of the MIM structure 20 provided in each of the through holes 11) is folded at the vicinity of the center of the each of the through holes 11 in the depth direction thereof, so that in the each of the through holes 11, the electric current flows back and forth for a distance corresponding to a half of the depth of the each of the through holes 11. Therefore, according to the thin film capacitor 1, a length of an electric current path of an electric current flowing through the MIM structure 20 is decreased compared with that of the conventional trench capacitor 301 in which an electric current flows back and forth for a length corresponding to the depth of the trench 311. More specifically, according to the thin film capacitor 1, a length of an electric current path of an electric current flowing in the thickness direction of the base member 10 is decreased.

In the thin film capacitor 1, an electric current supplied to the external electrode 2 flows from the lower-side electrode portion 2b through the connection electrode portion 2c to the upper-side electrode portion 2a thereof, and thus a length of an electric current path is increased by a length of the connection electrode portion 2c. However, since the thickness T1 of the connection electrode portion 2c is ten or more times as large as each of the thickness t1 of the lower electrode layer 22 and the thickness t2 of the upper electrode layer 23, an electric current path passing through the connection electrode portion 2c causes almost no increase in ESR of the thin film capacitor 1 as a whole.

Electric current vectors of electric currents flowing through the thin film capacitor 1 configured as shown in FIG. 2 were identified by simulation. As a result, there were identified, in the through holes 11, electric current vectors directed respectively from the upper surface 10a and the lower surface 10c toward the center of each of the through holes 11 in the depth direction thereof and electric current vectors oppositely directed from the center toward the upper surface 10a and the lower surface 10b, respectively. This confirmed that, in the thin film capacitor 1, there were generated flows of electric currents that had flowed into each of the through holes 11 from upper and lower sides and then were folded at the vicinity of the center of the each of the through holes 11 in the depth direction thereof.

Figure 4:
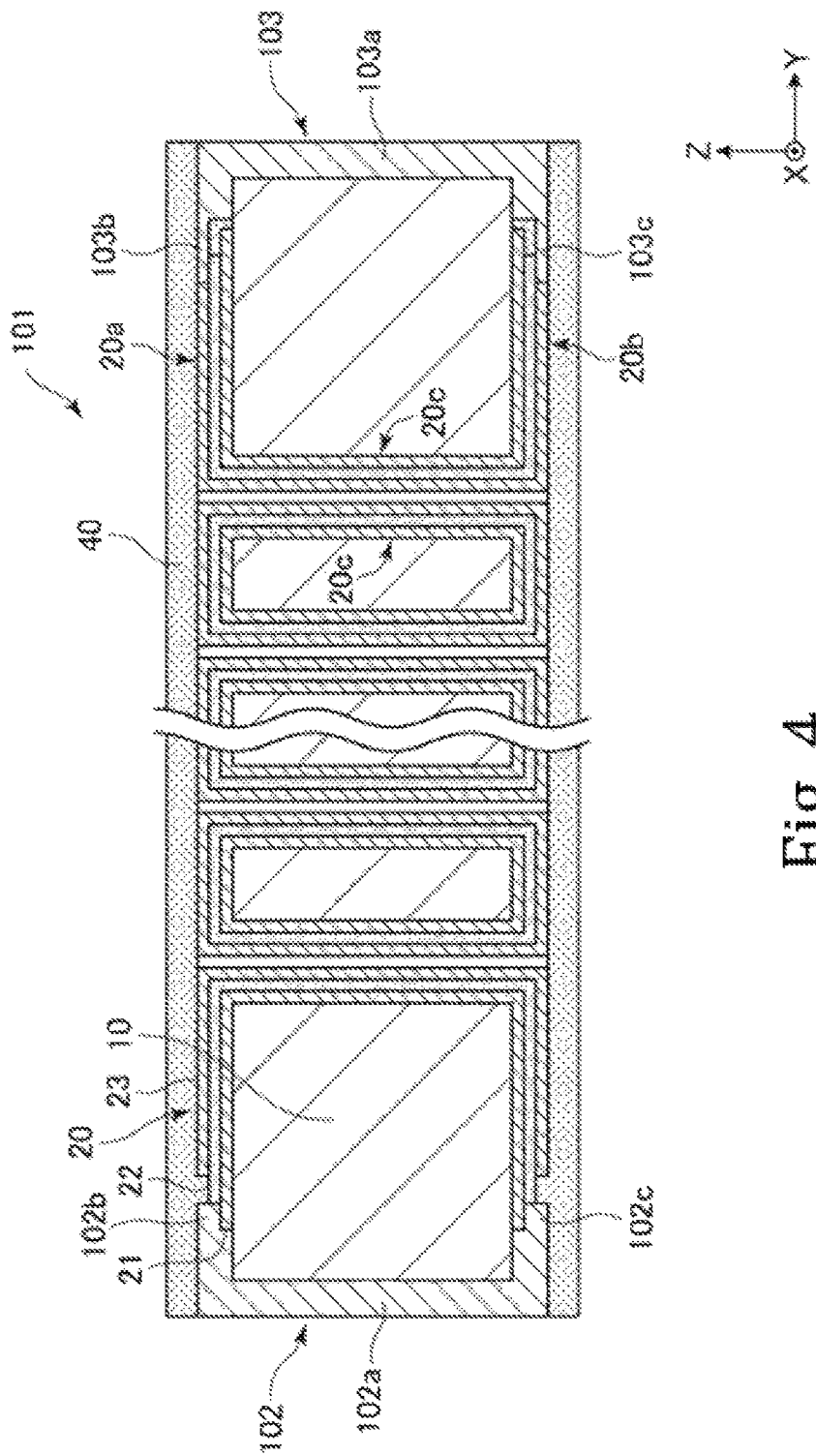
FIG. 4 is a sectional view schematically showing, on an enlarged scale, part of a YZ section of a thin film capacitor according to another embodiment.

Next, with reference to FIG. 4, a description is given of a thin film capacitor 101 according to another embodiment. FIG. 4 is a sectional view schematically showing, on an enlarged scale, part of a YZ section of the thin film capacitor 101. The thin film capacitor 101 is different from the thin film capacitor 1 in that an external electrode 102 is provided in place of the external electrode 2, an external electrode 103 is provided in place of the external electrode 3, and lead-out electrodes 102b, 102c, 103b, and 103c are provided in place of the lead-out electrodes 2d, 2e, 3d, and 3e.

The external electrode 102 has a plate-like shape and is provided on a left end surface of a base member 10. The external electrode 102 is connected to a lower electrode layer 21 at an upper surface portion 20a of a MIM structure 20 via the lead-out electrode 102b extending from an upper end of the external electrode 102 to an inner side of the base member 10 (in a Y-axis positive direction). Furthermore, the external electrode 102 is connected to the lower electrode layer 21 at a lower surface portion 20b of the MIM structure 20 via the lead-out electrode 102c extending from a lower end of the external electrode 102 to the inner side of the base member 10 (in the Y-axis positive direction).

The external electrode 103 has a plate-like shape and is provided on a right end surface of the base member 10. The external electrode 103 is connected to an upper electrode layer 23 at the upper surface portion 20a of the MIM structure 20 via the lead-out electrode 103b extending from an upper end of the external electrode 103 to the inner side of the base member 10 (in a Y-axis negative direction). Furthermore, the external electrode 103 is connected to the upper electrode layer 23 at the lower surface portion 20b of the MIM structure 20 via the lead-out electrode 103c extending from a lower end of the external electrode 103 to the inner side of the base member 10 (in the Y-axis negative direction).

The external electrode 102 and the external electrode 103 are each configured to extend to at least one of an upper surface of an upper-side protective layer 40 and a lower surface of a lower-side protective layer 40. Thus, the thin film capacitor 101 is mounted on a circuit board by using an upper surface or a lower surface of the thin film capacitor 101 as a mounting surface.

Hereinafter, advantageous effects of the above-described embodiments will be described. According to the above-described embodiment, an electric current from a first external electrode 2 flows into the MIM structure 20 from a first portion 20a thereof provided near the upper surface 10a of the base member 10 and from a second portion 20b thereof provided near the lower surface 10b of the base member 10. That is, an electric current from the first external electrode 2 flows in the form of parallel flows into the MIM structure 20, and these parallelized electric currents flow in the MIM structure 20. As described above, an electric current from the first external electrode 2 flows in the form of parallel flows in the MIM structure 20 to reach a second external electrode 3, and thus an ESR in the MIM structure 20 can be reduced.

According to the above-described embodiment, in a third portion 20c of the MIM structure 20, there are generated flows of electric currents that flow respectively from both ends of each of the through holes 11 in the depth direction toward the center thereof, are folded at the vicinity of the center, and then flow from the center toward the both ends, respectively. A path length of an electric current flowing in the third portion 20c of the MIM structure 20 toward the center is about half the depth of the through holes 11, and a path length of the electric current having been folded and flowing from the center to near the surface of the base member 10 is also half the depth of the through holes 11, so that a total path length of the electric current flowing through the third portion 20c of the MIM structure 20 is about the same as the depth of the through holes 11. On the other hand, in the conventional trench capacitor, a path length of an electric current flowing in each of the bottomed trenches is about double the depth of the trenches. Consequently, according to the above-described embodiment, a path length of an electric current flowing in the thickness direction of the base member 10 can be decreased compared with that of the conventional trench capacitor. Thus, an ESR of the thin film capacitor 1 can be reduced.

According to the above-described embodiment, the MIM structure 20 is embedded in the through holes 11 penetrating the base member 10 from the upper surface 10a to the lower surface 10b thereof, and thus a surface area of the MIM structure 20 can be increased compared with that of the conventional trench capacitor in which the MIM structure is embedded in the bottomed trenches. Thus, according to the thin film capacitor 1 of the above-described embodiment, a capacitance per unit area can be increased compared with that of the conventional trench capacitor in which the MIM structure is embedded in the bottomed trenches. Furthermore, according to the thin film capacitor 1 of the above-described embodiment, even when the dielectric layer in the MIM structure is increased in thickness, there can be generated about the same capacitance as in the case of the conventional trench capacitor in which the MIM structure is embedded in the bottomed trenches. Hence, according to the above-described embodiment, a thin film capacitor 1 excellent in insulation reliability can be obtained. In addition, according to the above-described embodiment, even when the base member 10 is decreased in thickness, there can be generated about the same capacitance as in the case of the conventional trench capacitor in which the MIM structure is embedded in the bottomed trenches. Hence, according to the above-described embodiment, the thin film capacitor 1 having a reduced profile can be obtained.

In a case where the above-described thin film capacitor 1 is installed on a circuit board, the upper-side electrode portion 2a or the lower-side electrode portion 2b of the external electrode 2 is joined to a bump of the circuit board. For example, in a case where the lower-side electrode portion 2b is connected to the bump of the circuit board, an electric current that has flowed from the circuit board into the external electrode 2 via the lower-side electrode portion 2b flows to the upper-side electrode portion 2a through the connection electrode portion 2c. Accordingly, in the thin film capacitor 1, an electric current path length is increased by a length of the connection electrode portion 2c. However, with the thickness of the connection electrode portion 2c being larger than each of the thickness t1 of the lower electrode layer 22 and the thickness t2 of the upper electrode layer 23, it is possible to suppress the influence of an increase in ESR in the connection electrode portion 2c on an ESR in an entire path in the thin film capacitor 1. In particular, with the thickness of the connection electrode portion 2c being ten or more times as large as the thickness t1 of the lower electrode layer 22 and/or the thickness t2 of the upper electrode layer 23, the influence of an added electric current path in the connection electrode portion 2c on an ESR in an entire path in the MIM structure 20 can be significantly reduced.

In the thin film capacitor 1, the external electrode 2 includes the upper-side electrode portion 2a provided on the upper surface 10a of the base member 10 and the lower-side electrode portion 2b provided on the lower surface 10a of the base member 10, and the external electrode 3 includes the upper-side electrode portion 3a provided on the upper surface 10a of the base member 10 and the lower-side electrode portion 3b provided on the lower surface 10a of the base member 10, so that the thin film capacitor 1 can also be mounted upside down on the circuit board. As described above, in the thin film capacitor 1, a high degree of freedom can be provided in a mounting process.

In the thin film capacitor 101, the external electrode 2 does not protrude upward from the upper surface of the protective layer 40, and the external electrode 3 does not protrude downward from the lower surface of the protective layer 40. Thus, the thin film capacitor 101 can be further reduced in profile.

The dimensions, materials, and arrangements of the various constituent elements described herein are not limited to those explicitly described in the embodiments, and the various constituent elements can be modified to have any dimensions, materials, and arrangements within the scope of the present invention. Furthermore, constituent elements not explicitly described herein can also be added to the embodiments described, and it is also possible to omit some of the constituent elements described in the embodiments.

Herein, when it is explained that one object is provided "on," "on an upper surface of," "below," or "on a lower surface of" another object, the one object may be directly in contact with the another object or indirectly in contact with the another object via another layer or film. For example, in a case where it is explained that the protective layer 40 is provided on the MIM structure 20, the protective layer 40 may be directly provided on the MIM structure 20 (so as to be in contact with the MIM structure 20) or indirectly provided on the MIM structure 20 via another layer (for example, a barrier layer).

What is claimed is:

1. A capacitor, comprising: a base member having a first surface and a second surface opposed to the first surface, a plurality of through holes extending through the base member between the first surface and the second surface; a MIM structure including: a first dielectric layer; a first electrode layer provided on one surface of the first dielectric layer; and a second electrode layer provided on another surface of the first dielectric layer; a first external electrode electrically connected to the MIM structure; and a second external electrode electrically connected to the MIM structure and spaced from the first external electrode, wherein each of the first dielectric layer, the first electrode layer, and the second electrode layer extends from a first portion to a second portion of the MIM structure through each of the plurality of through holes, the first portion extending along the first surface of the base member, and the second portion extending along the second surface of the base member, wherein the first external electrode is directly electrically connected to one of the first electrode layer and the second electrode layer both at the first portion and the second portion; and wherein the second external electrode is directly electrically connected to another of the first electrode layer and the second electrode layer both at the first portion and the second portion.

2. The capacitor according to claim 1, wherein the first external electrode includes:
- a first electrode portion extending along the first surface;
- a second electrode portion extending along the second surface; and
- a first connection electrode portion connecting the first electrode portion to the second electrode portion, and wherein the second external electrode includes:
- a third electrode portion extending along the first surface;
- a fourth electrode portion extending along the second surface; and
- a second connection electrode portion connecting the third electrode portion to the fourth electrode portion.

3. The capacitor according to claim 2, wherein the first external electrode is configured so that a thickness T1 of the first connection electrode portion is ten or more times as large as a thickness t1 of the first electrode layer.

4. The capacitor according to claim 2, wherein the first external electrode is configured so that a thickness T1 of the first connection electrode portion is ten or more times as large as a thickness t2 of the second electrode layer.

5. The capacitor according to claim 2, wherein the second external electrode is configured so that a thickness T2 of the second connection electrode portion is ten or more times as large as a thickness t1 of the first electrode layer.

6. The capacitor according to claim 2, wherein the second external electrode is configured so that a thickness T2 of the second connection electrode portion is ten or more times as large as the thickness t2 of the second electrode layer.

7. The capacitor according to claim 1, further comprising:
- a protective layer provided so as to cover the MIM structure.

8. A circuit board comprising the capacitor according to claim 1.

9. An electronic device comprising the circuit board according to claim 8.

* * * * *